(12) United States Patent
Rouillard et al.

(10) Patent No.: US 6,797,018 B2
(45) Date of Patent: Sep. 28, 2004

(54) SOLID-STATE ENERGY STORAGE MODULE EMPLOYING INTEGRATED INTERCONNECT BOARD

(75) Inventors: Jean Rouillard, Saint-Luc (CA); Christophe Comte, Montreal (CA); Dominik Daigle, St-Hyacinthe (CA); Ronald A. Hagen, Stillwater, MN (US); Orlin B. Knudson, Vadnais Heights, MN (US); André Morin, Longueuil (CA); Michel Ranger, Lachine (CA); Guy Ross, Beloeil (CA); Roger Rouillard, Beloeil (CA); Philippe St-Germain, Outremont (CA); Anthony Sudano, Laval (CA); Thomas A. Turgeon, Fridley, MN (US)

(73) Assignees: 3M Innovative Properties Company, St. Paul, MN (US); Hydro-Quebec Corporation, Montreal (CA)

( * ) Notice: Subject to any disclaimer, the term of this patent is extended or adjusted under 35 U.S.C. 154(b) by 0 days.

(21) Appl. No.: 10/448,629

(22) Filed: May 30, 2003

(65) Prior Publication Data

US 2003/0213121 A1 Nov. 20, 2003

Related U.S. Application Data

(62) Division of application No. 09/665,810, filed on Sep. 20, 2000, now Pat. No. 6,621,942, which is a division of application No. 08/900,427, filed on Jul. 25, 1997, now Pat. No. 6,146,778.

(51) Int. Cl.[7] .............................................. H01M 10/38

(52) U.S. Cl. ...................... 29/623.2; 429/7; 429/121; 439/55

(58) Field of Search ........................ 29/623.2; 429/7, 429/121; 439/55

(56) References Cited

U.S. PATENT DOCUMENTS

| | | | |
|---|---|---|---|
| 2,812,376 A | 11/1957 | Yardney | |
| 3,193,412 A | 7/1965 | Sutherland et al. | |
| 3,275,770 A | 9/1966 | Klimer et al. | |
| 3,339,169 A | * 8/1967 | Freeland | 439/55 |
| 3,390,014 A | 6/1968 | Eisler | |
| 3,578,506 A | 5/1971 | Chassoux | |
| 3,630,783 A | 12/1971 | Przybyla | 136/107 |
| 3,786,466 A | 1/1974 | Naito et al. | |
| 3,793,501 A | 2/1974 | Stonestrom | |
| 3,899,355 A | 8/1975 | Chiklis | |
| 3,937,635 A | 2/1976 | Mead et al. | 136/83 R |
| 4,028,479 A | 6/1977 | Fanciullo et al. | 429/152 |
| 4,060,669 A | 11/1977 | Fanciullo | 429/152 |

(List continued on next page.)

FOREIGN PATENT DOCUMENTS

| | | |
|---|---|---|
| DE | 3246968 A1 | 7/1984 |
| DE | 4218381 C1 | 5/1993 |
| DE | 42 25 746 A1 | 2/1994 |

(List continued on next page.)

Primary Examiner—John S. Maples

(57) ABSTRACT

An electrochemical energy storage device includes a number of solid-state thin-film electrochemical cells which are selectively interconnected in series or parallel through use of an integrated interconnect board. The interconnect board is typically disposed within a sealed housing which also houses the electrochemical cells, and includes a first contact and a second contact respectively coupled to first and second power terminals of the energy storage device. The interconnect board advantageously provides for selective series or parallel connectivity with the electrochemical cells, irrespective of electrochemical cell position within the housing. Fuses and various electrical and electro-mechanical devices, such as bypass, equalization, and communication devices for example, may also be mounted to the interconnect board and selectively connected to the electrochemical cells.

7 Claims, 13 Drawing Sheets

U.S. PATENT DOCUMENTS

| | | |
|---|---|---|
| 4,060,670 A | 11/1977 | Fanciullo ............... 429/154 |
| 4,061,955 A | 12/1977 | Thomas et al. |
| 4,080,728 A | 3/1978 | Buckler ................ 29/623.4 |
| 4,091,186 A | 5/1978 | Ott et al. |
| 4,098,965 A | 7/1978 | Kinsman ............... 429/153 |
| 4,105,807 A | 8/1978 | Arora .................. 427/126 |
| 4,137,627 A | 2/1979 | Kinsman ............... 29/623.4 |
| 4,150,266 A | 4/1979 | Patrichi |
| 4,152,825 A | 5/1979 | Bruneau ............... 29/623.2 |
| 4,207,389 A | 6/1980 | Gunther et al. ......... 429/164 |
| 4,209,479 A | 6/1980 | Gunther et al. ......... 264/104 |
| 4,233,371 A | 11/1980 | Dorrestijn ............. 429/152 |
| 4,238,721 A | 12/1980 | DeLuca et al. |
| 4,241,152 A | 12/1980 | Klink |
| 4,303,877 A | 12/1981 | Meinhold |
| 4,321,435 A | 3/1982 | Grieger et al. |
| 4,322,484 A | 3/1982 | Sugalski |
| 4,339,638 A | 7/1982 | Lascelles et al. |
| 4,342,978 A | 8/1982 | Meister |
| 4,370,531 A | 1/1983 | Tobin |
| 4,383,013 A | 5/1983 | Bindin et al. |
| 4,409,086 A | 10/1983 | Haas et al. |
| 4,409,538 A | 10/1983 | Tabata |
| 4,429,026 A | 1/1984 | Bruder ................. 429/152 |
| 4,436,792 A | 3/1984 | Tomino et al. |
| 4,477,545 A | 10/1984 | Akridge et al. ......... 429/191 |
| 4,479,083 A | 10/1984 | Sullivan |
| 4,490,707 A | 12/1984 | O'Leary |
| 4,495,259 A | 1/1985 | Uba |
| 4,507,857 A | 4/1985 | Epstein et al. ......... 29/623.2 |
| 4,517,265 A | 5/1985 | Belanger et al. |
| 4,518,665 A | 5/1985 | Fujita et al. |
| 4,525,439 A | 6/1985 | Simonton ............... 429/162 |
| 4,547,438 A | 10/1985 | McArthur et al. ........ 429/82 |
| 4,571,468 A | 2/1986 | Weldon |
| 4,654,278 A | 3/1987 | McManis, III et al. |
| 4,664,993 A | 5/1987 | Sturgis et al. ......... 429/178 |
| 4,670,703 A | 6/1987 | Williams |
| 4,691,085 A | 9/1987 | Swanson |
| 4,692,577 A | 9/1987 | Swanson |
| 4,707,795 A | 11/1987 | Alber et al. |
| 4,752,540 A | 6/1988 | Chua et al. ............ 429/56 |
| 4,758,483 A | 7/1988 | Armand et al. |
| 4,816,354 A | 3/1989 | Tamminen .............. 429/162 |
| 4,824,746 A | 4/1989 | Belanger et al. |
| 4,828,939 A | 5/1989 | Turley et al. |
| 4,851,307 A | 7/1989 | Armand et al. |
| 4,852,684 A | 8/1989 | Packard |
| 4,883,726 A | 11/1989 | Peled et al. ........... 424/120 |
| 4,887,348 A | 12/1989 | Tamminen .............. 29/623.2 |
| 4,897,917 A | 2/1990 | Gauthier et al. |
| 4,911,993 A | 3/1990 | Turley ................. 29/623.2 |
| 4,913,259 A | 4/1990 | Packard |
| 4,923,582 A | 5/1990 | Abrahamson et al. |
| 4,927,717 A | 5/1990 | Turley et al. .......... 429/27 |
| 4,961,043 A | 10/1990 | Koenck |
| 4,967,136 A | 10/1990 | Nofzinger |
| 4,971,531 A | 11/1990 | Aikioniemi |
| 4,973,936 A | 11/1990 | Dimpault-Darcy et al. |
| 4,997,732 A | 3/1991 | Austin et al. .......... 429/153 |
| 5,008,161 A | 4/1991 | Johnston ............... 429/7 |
| 5,057,385 A | 10/1991 | Hope et al. |
| 5,066,555 A | 11/1991 | Tamminen .............. 429/121 |
| 5,070,787 A | 12/1991 | Weldon et al. |
| 5,071,652 A | 12/1991 | Jones et al. |
| 5,089,027 A | 2/1992 | Rossoll et al. ......... 29/623.2 |
| 5,162,171 A | 11/1992 | Jones |
| 5,180,641 A | 1/1993 | Burns et al. |
| 5,197,889 A | 3/1993 | Rizzo et al. |
| 5,199,239 A | 4/1993 | Younger |
| 5,204,194 A | 4/1993 | Miller et al. |
| 5,227,259 A | 7/1993 | Weaver et al. |
| 5,227,264 A | 7/1993 | Duval et al. |
| 5,283,512 A | 2/1994 | Stadnick et al. |
| 5,300,373 A | 4/1994 | Shackle |
| 5,313,152 A | 5/1994 | Wozniak et al. |
| 5,324,597 A | 6/1994 | Leadbetter et al. |
| 5,337,042 A | 8/1994 | Hormel et al. |
| 5,346,786 A | 9/1994 | Hodgetts |
| 5,354,630 A | 10/1994 | Earl et al. |
| 5,363,405 A | 11/1994 | Hormel |
| 5,382,480 A | 1/1995 | Molyneux |
| 5,384,212 A | 1/1995 | Heiman et al. |
| 5,385,793 A | 1/1995 | Tiedemann et al. |
| 5,393,617 A | 2/1995 | Klein |
| 5,401,595 A | 3/1995 | Kagawa et al. |
| 5,409,787 A | 4/1995 | Blanyer et al. |
| 5,415,954 A | 5/1995 | Gauthier et al. |
| 5,422,200 A | 6/1995 | Hope et al. |
| 5,423,110 A | 6/1995 | Gauthier et al. |
| 5,438,249 A | 8/1995 | Chang et al. |
| 5,478,667 A | 12/1995 | Shackle et al. |
| 5,478,668 A | 12/1995 | Gozdz et al. |
| 5,479,083 A | 12/1995 | Brainard |
| 5,487,958 A | 1/1996 | Tura |
| 5,503,947 A | 4/1996 | Kelly et al. |
| 5,503,948 A | 4/1996 | MacKay et al. |
| 5,504,415 A | 4/1996 | Podrazhansky et al. |
| 5,519,563 A | 5/1996 | Higashijima et al. |
| 5,521,024 A | 5/1996 | Sasaki et al. |
| 5,528,122 A | 6/1996 | Sullivan et al. |
| 5,530,336 A | 6/1996 | Eguchi et al. |
| 5,532,087 A | 7/1996 | Nerz et al. |
| 5,547,775 A | 8/1996 | Eguchi et al. |
| 5,547,780 A | 8/1996 | Kagawa et al. |
| 5,548,200 A | 8/1996 | Nor et al. |
| 5,552,243 A | 9/1996 | Klein |
| 5,556,576 A | 9/1996 | Kim et al. |
| 5,561,380 A | 10/1996 | Sway-Tin et al. |
| 5,563,002 A | 10/1996 | Harshe |
| 5,567,539 A | 10/1996 | Takahashi et al. |
| 5,568,039 A | 10/1996 | Fernandez |
| 5,569,063 A | 10/1996 | Morioka et al. |
| 5,569,550 A | 10/1996 | Garrett et al. |
| 5,573,869 A | 11/1996 | Hwang et al. |
| 5,582,931 A | 12/1996 | Kawakami |
| 5,585,207 A | 12/1996 | Wakabe et al. |
| 5,589,290 A | 12/1996 | Klink et al. |
| 5,593,604 A | 1/1997 | Beasley et al. |
| 5,594,320 A | 1/1997 | Pacholok et al. |
| 5,595,835 A | 1/1997 | Miyamoto et al. |
| 5,595,839 A | 1/1997 | Hossain |
| 5,599,636 A | 2/1997 | Braun |
| 5,600,230 A | 2/1997 | Dunstan |
| 5,602,481 A | 2/1997 | Fukuyama |
| 5,607,793 A * | 3/1997 | Alexandres et al. ........ 429/100 |
| 5,610,495 A | 3/1997 | Yee et al. |
| 5,612,153 A | 3/1997 | Moulton et al. |
| 5,618,641 A | 4/1997 | Arias |
| 5,619,417 A | 4/1997 | Kendall |
| 5,620,808 A | 4/1997 | Wheeler et al. |
| 5,622,789 A | 4/1997 | Young |
| 5,623,196 A | 4/1997 | Fernandez et al. |
| 5,626,990 A | 5/1997 | Miller et al. |
| 5,631,537 A | 5/1997 | Armstrong |
| 5,633,573 A | 5/1997 | van Phuoc et al. |
| 5,637,981 A | 6/1997 | Nagai et al. |
| 5,643,044 A | 7/1997 | Lund |
| 5,647,534 A | 7/1997 | Kelz et al. |
| 5,648,713 A | 7/1997 | Mangez |
| 5,650,240 A | 7/1997 | Rogers |

| | | | |
|---|---|---|---|
| 5,652,498 A | 7/1997 | Edye et al. | |
| 5,652,502 A | 7/1997 | van Phuoc et al. | |
| 5,654,622 A | 8/1997 | Toya et al. | |
| 5,670,272 A | 9/1997 | Cheu et al. ................. 429/162 | |
| 5,824,432 A | 10/1998 | Currle | |

FOREIGN PATENT DOCUMENTS

| | | |
|---|---|---|
| DE | G 94 15 874.6 | 12/1994 |
| DE | 19618897 A1 | 11/1997 |
| EP | 044 753 A1 | 1/1982 |
| EP | 145 498 A2 | 6/1985 |
| EP | 0 170 883 A1 | 2/1986 |
| EP | 177 225 A1 | 4/1986 |
| EP | 0 225 762 A2 | 6/1987 |
| EP | 244 683 A1 | 11/1987 |
| EP | 310 075 A2 | 4/1989 |
| EP | 336 102 A2 | 10/1989 |
| EP | 569 035 A1 | 11/1993 |
| EP | 570 590 A1 | 11/1993 |
| EP | 584 639 A1 | 3/1994 |
| EP | 643 429 A2 | 3/1995 |
| EP | 652 620 A1 | 5/1995 |
| EP | 700 109 A1 | 3/1996 |
| EP | 0 721 247 A2 | 7/1996 |
| EP | 774 795 A2 | 5/1997 |
| EP | 780 920 A1 | 6/1997 |
| FR | 2 511 547 | 2/1983 |
| FR | 2 721 407 | 12/1995 |
| GB | 1582979 | 1/1981 |
| GB | 2 206 726 A | 1/1989 |
| GB | 2 282 924 A | 4/1995 |
| JP | 59-091658 | 5/1984 |
| JP | 59117061 | 7/1984 |
| JP | 59139555 | 8/1984 |
| JP | 61099278 | 5/1986 |
| JP | 63062156 | 3/1988 |
| JP | 01320758 | 12/1989 |
| JP | 04294071 | 10/1992 |
| JP | 05166533 | 7/1993 |
| JP | 6-036756 | 2/1994 |
| JP | 6-203823 | 7/1994 |
| JP | 07250788 | 10/1995 |
| JP | 07282841 | 10/1995 |
| JP | 08115711 | 5/1996 |
| JP | 2295718 | 6/1996 |
| JP | 09-017416 | 1/1997 |
| SU | 1066-385 A | 6/1986 |
| WO | WO 91/17451 | 11/1991 |
| WO | WO 92/02963 | 2/1992 |
| WO | WO 93/01624 | 1/1993 |
| WO | WO 94/14206 | 6/1994 |
| WO | WO 95/00978 | 1/1995 |
| WO | WO 95/26055 | 9/1995 |
| WO | WO 95/34824 | 12/1995 |
| WO | WO 96/17397 | 6/1996 |
| WO | WO 96/19816 | 6/1996 |
| WO | WO 96/22523 | 7/1996 |
| WO | WO 98/11620 | 3/1998 |

* cited by examiner

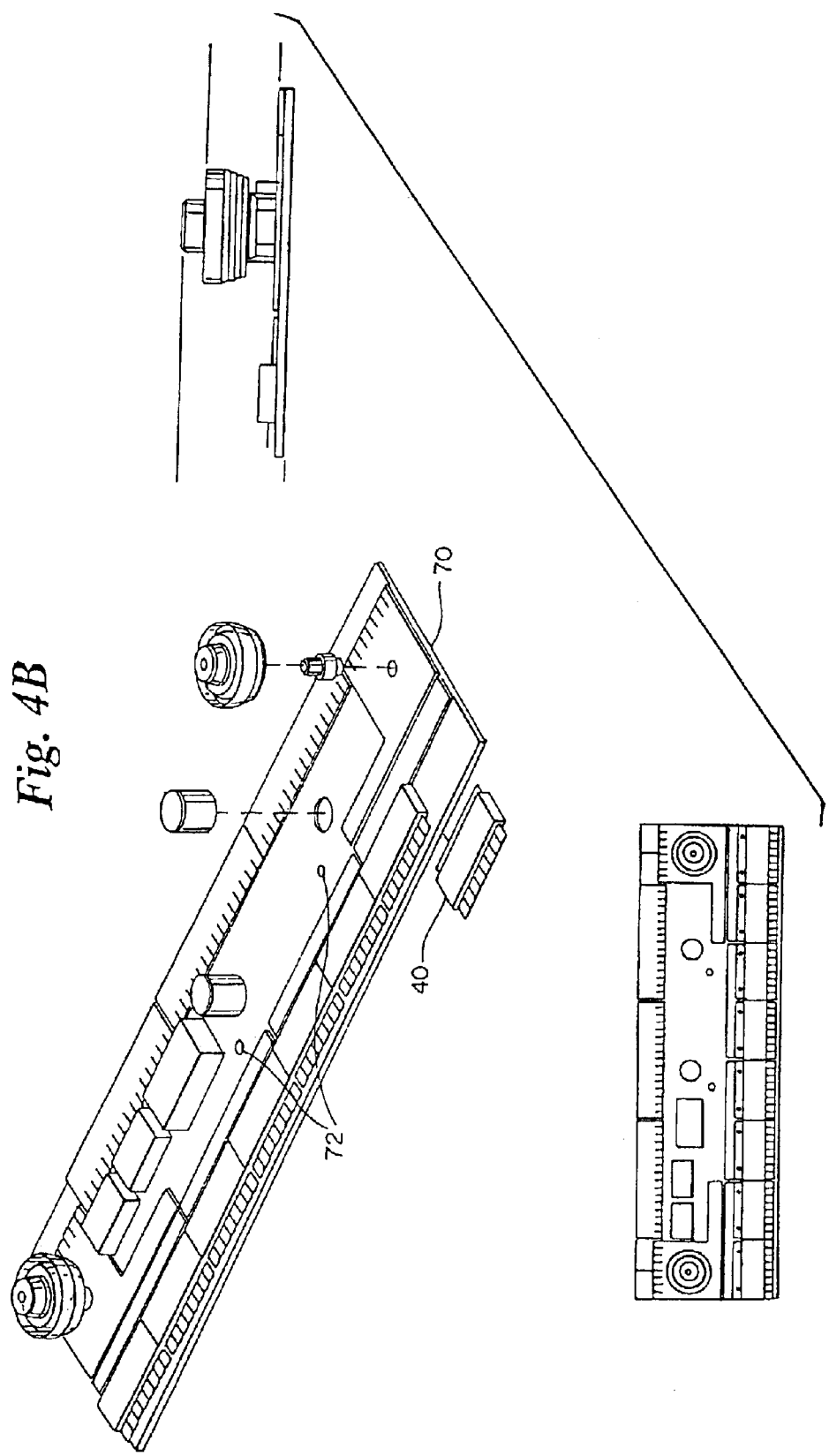

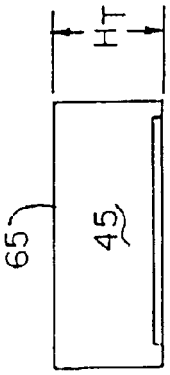
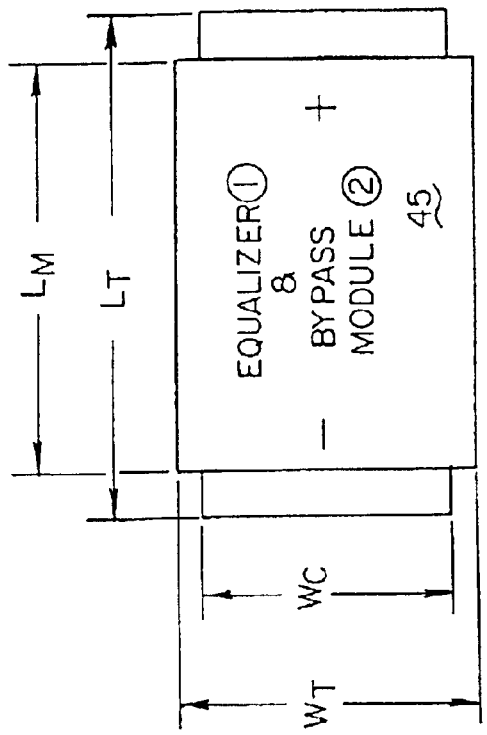
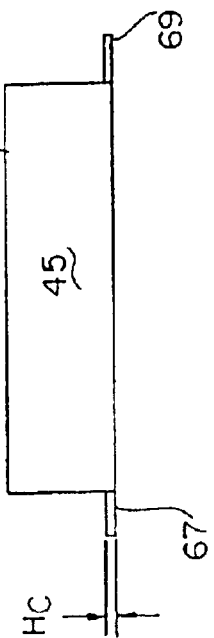

SOLID-STATE ENERGY STORAGE MODULE EMPLOYING INTEGRATED INTERCONNECT BOARD

This application is a division of application Ser. No. 09/665,810, filed on Sep. 20, 2000, now U.S. Pat. No. 6,621,942, which is a division of application Ser. No. 08/900,427, filed on Jul. 25, 1997, now U.S. Pat. No. 6,146,778.

GOVERNMENT LICENSE RIGHTS

The Government of the United States of America has rights in this invention pursuant to Cooperative Agreement No. DE-FC02-91CE50336 awarded by the U.S. Department of Energy.

FIELD OF THE INVENTION

This invention relates generally to energy storage devices, and more particularly, to an apparatus and method for selectively interconnecting a number of independent energy storage cells disposed in a sealed housing.

BACKGROUND OF THE INVENTION

The demand for new and improved electronic and electromechanical systems has placed increased pressure on the manufacturers of energy storage devices to develop battery technologies that provide for high energy generation in a low-volume package. Conventional battery systems, such as those that utilize lead acid for example, are often unsuitable for use in high-power, low-weight applications. Other known battery technologies may be considered too unstable or hazardous for use in consumer product applications.

A number of advanced battery technologies have recently been developed, such as metal hydride (e.g., Ni-MH), lithium-ion, and lithium polymer cell technologies, which would appear to provide the requisite level of energy production and safety margins for many commercial and consumer applications. Such advanced battery technologies, however, often exhibit characteristics that provide challenges for the manufacturers of advanced energy storage devices.

In accordance with a conventional advanced battery design, individual cells are hardwired together and to the positive and negative power terminals of the battery. Various electronic components which may be incorporated into the battery design must also be hardwired to the cells. It can be appreciated that such conventional interconnection approaches provide for little, if any, flexibility when attempting to alter the series and/or parallel hardwired connections between the cells and components.

Moreover, the wiring process typically employed in the fabrication of conventional advanced batteries is generally complicated and time consuming. An assembly defect of particular concern to the manufacturers of conventional advanced batteries involves unintentional wiring shorts which develop during the wiring process. Such manufacturing defects typically result in a reduction in the performance and service life of the battery, and often represent a significant safety concern.

Other characteristics of advanced battery technologies provide additional challenges for the designers of advanced energy storage devices. For example, certain advanced cell structures are subject to cyclical changes in volume as a consequence of variations in the state of charge of the cell. The total volume of such a cell may vary as much as five to six percent during charge and discharge cycling. Such repetitive changes in the physical size of a cell significantly complicates the mechanical housing design, and electrical connection strategy. The electrochemical, thermal, and mechanical characteristics of an advanced battery cell must typically be well understood and appropriately considered when designing an energy storage system suitable for use in commercial and consumer devices and systems.

There is a need in the advanced battery manufacturing industry for an energy storage device that exhibits high-energy output, and one that provides for safe and reliable use in a wide range of applications. There exists a further need for an effective interconnection strategy which provides flexibility and reliability when interconnecting a number of independent energy storage cells contained within a sealed housing to meet specified current and voltage ratings. The present invention fulfills these and other needs.

SUMMARY OF THE INVENTION

The present invention is directed to an improved electrochemical energy storage device. The electrochemical energy storage device includes a number of solid-state, thin-film electrochemical cells which are selectively interconnected in series or parallel through use of an integrated interconnect board. The interconnect board is typically disposed within a sealed housing or shell which also houses the electrochemical cells, and includes a first contact and a second contact respectively coupled to first and second power terminals of the energy storage device. The interconnect board advantageously provides for selective series or parallel connectivity with the electrochemical cells, irrespective of cell position relative to one another within the housing. In one embodiment, a sheet of conductive material is processed by employing a known milling, stamping, or chemical etching technique to include a connection pattern which provides for flexible and selective interconnecting of individual electrochemical cells within the housing, which may be a hermetically sealed housing. The voltage and current characteristics of the energy storage device are alterable by altering the configuration of the connection pattern. Fuses and various electrical and electro-mechanical devices, such as bypass, equalization, and communication devices for example, may also be mounted to the interconnect board and selectively connected to the electrochemical cells.

BRIEF DESCRIPTION OF THE DRAWINGS

FIG. 4B illustrates yet another embodiment of an integrated interconnect board;

FIGS. 5A–5C is an illustration of a component package within which equalizer and bypass devices are integrally incorporated;

DETAILED DESCRIPTION OF THE EMBODIMENTS

Figure 1:
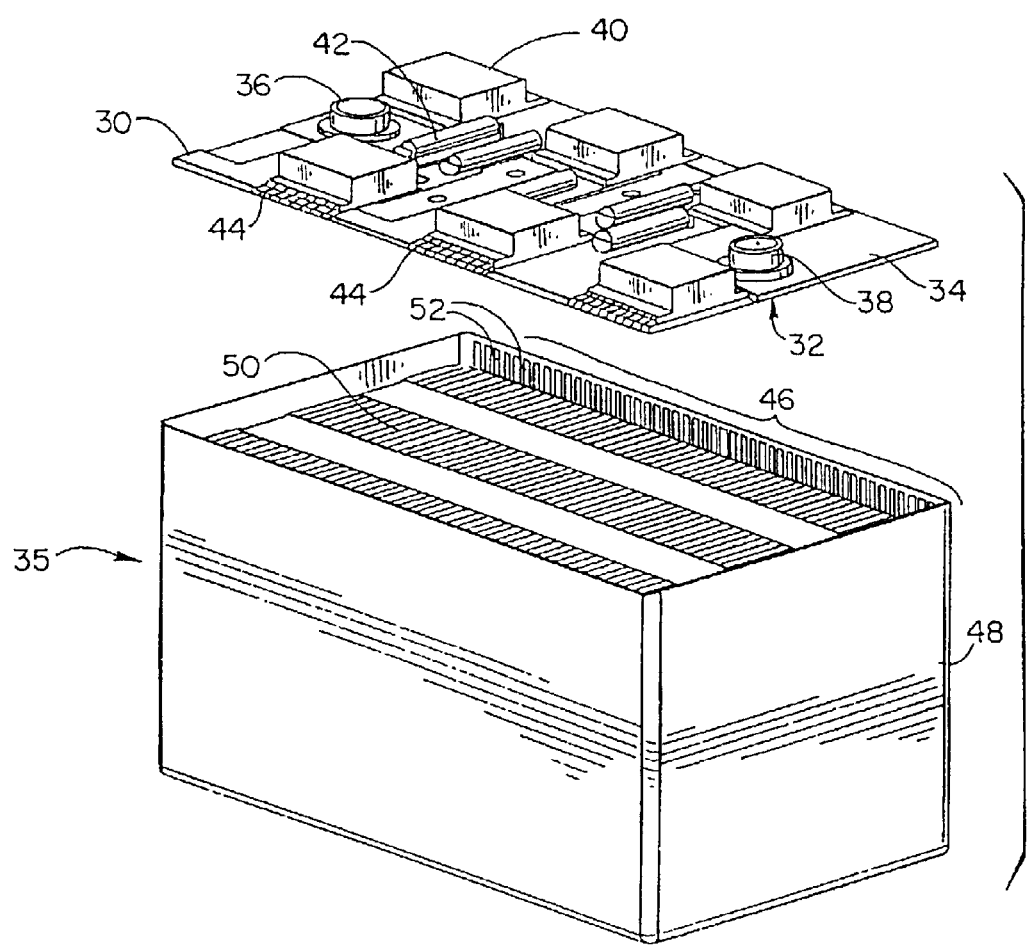
FIG. 1 illustrates an embodiment of a solid-state energy storage device which includes a stack of thin-film electrochemical cells selectively interconnected in a series and/or parallel relationship by use of an interconnect board.

Referring now to the drawings, and more particularly to FIG. 1, there is provided a partial illustration of an embodiment of an energy storage module 35 which utilizes a number of rechargeable solid-state thin-film electrochemical cells for storing electrical energy. Such rechargeable thin-film electrochemical cells are particularly well-suited for use in the construction of high-current, high-voltage energy storage modules and batteries, such as those used to power electric vehicles for example.

As is shown in FIG. 1, the energy storage module 35 includes a number of individual electrochemical cells 50 which are arranged in a stack configuration 46 and situated in a housing 48. Each of the electrochemical cells 50 includes a pair of electrical leads 52 disposed on opposing edges of the cells 50. It will be appreciated that a generic stack 46 of electrochemical cells 50 may be interconnected in various parallel and series relationships to achieve desired current and voltage ratings. To facilitate selective series or parallel connectivity within the stack 46 of electrochemical cells 50, an interconnect board 30 is situated within the housing 48.

The interconnect board 30 includes a connection pattern or conductivity grid 32 which, when the board 30 is installed within the housing 48, interconnects the electrochemical cells 50 in accordance with a pre-established connection configuration. The connection pattern or grid 32 is typically affixed or otherwise bonded to a sheet of insulating material 34, such as a substantially rigid plastic or laminate material. A number of electrical and electromechanical components may also be mounted on the interconnect board 30.

As is shown in FIG. 1, for example, the interconnect board 30 includes a number of fuse packs 40, equalizer and bypass devices 42, and positive and negative power terminals 38, 36. It is understood that any or all of the components populating the interconnect board 30 may be mounted on boards or platforms other than the interconnect board 30, and situated internal to or externally of the module housing 48. In one embodiment, the interconnect board 30 shown in FIG. 1 and the electrochemical cells 50 are disposed in a hermetically sealed housing 48, as will further be described with respect to FIG. 6.

Figure 2:
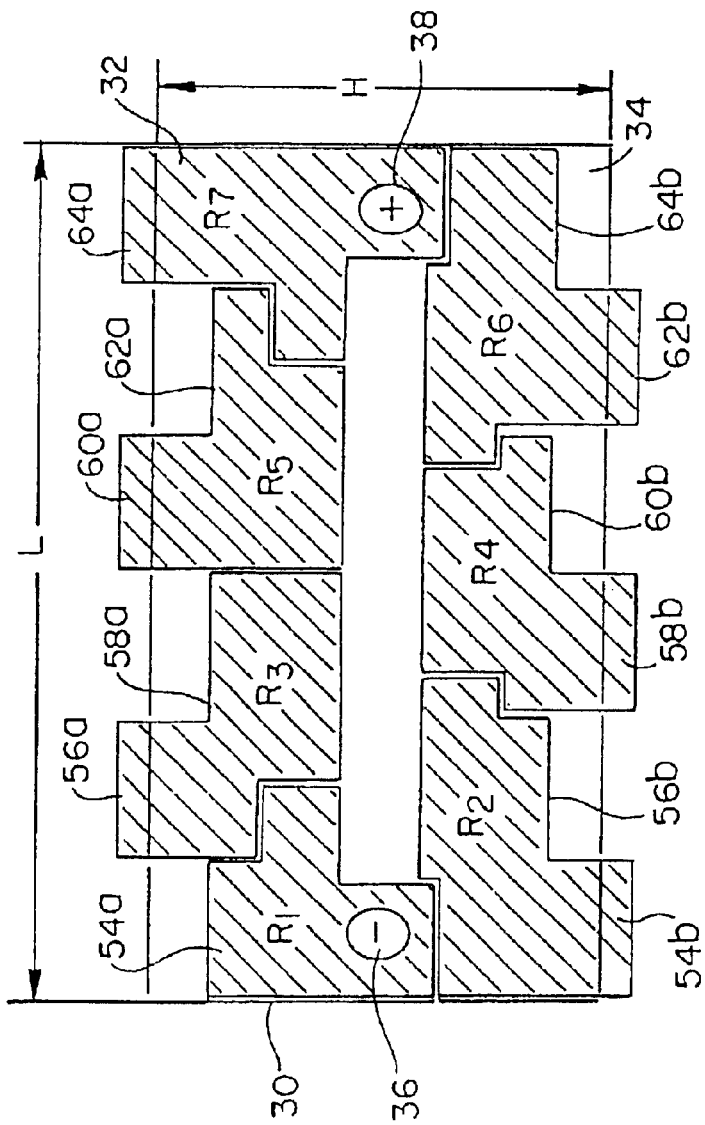
FIG. 2 illustrates a surface of an interconnect board having a connection pattern disposed thereon for providing selective series and/or parallel connectivity with a number of electrochemical cells.

As is best illustrated in FIG. 2, the interconnect board 30 typically includes a patterned conductive surface 32 which advantageously provides for the interconnecting of autonomous electrochemical cells 50 in accordance with a pre-designed connection layout. A significant advantage realized by employing an interconnect board 30 having a patterned interconnection surface 32 concerns the flexibility by which a desired current and voltage rating may be achieved irrespective of, and without disrupting, the position of individual electrochemical cells 50 relative to one another within the housing 48.

Figure 3:
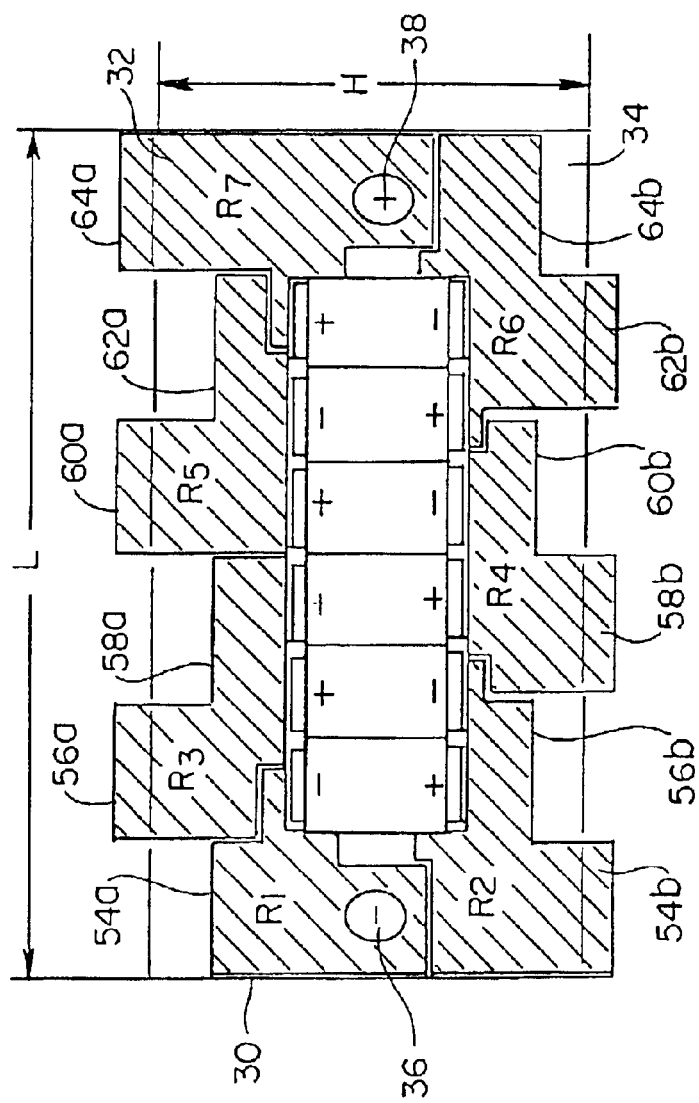
FIG. 3 is another illustration of an interconnect board which includes a sheet of conductive material including a connection pattern for selectively connecting a number or electrochemical cells in a series or parallel relationship.

By way of example, and with particular reference to FIGS. 2–3, the interconnect surface 32 of the interconnect board 30 is selectively patterned to achieve a desired cell connection configuration. In this embodiment, the interconnect surface 32 includes a number of electrically isolated connection regions which are pre-designed to electrically connect with the positive and negative contacts 52 of a particular number of electrochemical cells 50. In accordance with this illustrative embodiment, seven isolated connection regions, $R_1$–$R_7$, are shown as constituting the patterned interconnect surface 32 of the interconnect board 30.

When the interconnect board 30 is installed within the housing 48 and adjacent the electrochemical cell stack 46, the electrical contacts 52 of a first group of electrochemical cells 50 contact the connection region $R_1$ at a location 54a. The opposing set of electrical contacts 52 of the first group of electrochemical cells 50 electrically contact the connection region $R_2$ at a location 54b. In this configuration, the connection region $R_1$ is electrically connected to the negative power terminal 36.

A second group of electrochemical cells 50 have their respective opposing set of electrical contacts 52 connected to connection regions $R_3$ and $R_2$ at locations 56a and 56b, respectively. A third group of electrochemical cells 50 have their respective opposing electrical contacts 52 connected to connection regions $R_3$ and $R_4$ at locations 58a and 58b, respectively. Subsequent groupings of electrochemical cells 50 have their respective opposing electrical contacts 52 connected to connection regions $R_5$, $R_6$, and $R_7$ in a similar manner. It is noted that the connection region $R_7$ is electrically connected to the positive power terminal 38.

It is to be understood that any number of connection regions of varying configuration may be provided on the interconnect surface 32 of the interconnect board 30. Although each of the connection regions $R_1$–$R_7$ shown in FIGS. 2–3 electrically communicate with a group of electrochemical cells 50, it is understood that a connection region may be designated to electrically communicate with only a single electrochemical cell 50. It can be seen that the first group of electrochemical cells 50 are connected in a parallel relationship with respect to connection regions $R_1$ and $R_2$. Similarly, the second group of electrochemical cells 50 are connected in parallel with respect to connection regions $R_3$ and $R_2$.

Having established electrical connectivity with selected electrochemical cells 50 at selected isolated connection regions, the connection regions are then interconnected in a series or parallel manner through the use of electrical conductors and/or components. Bridging selected isolated connection regions in this manner defines a current path the permits current to flow through, for example, the positive power terminal 38, each of the connection regions $R_1$–$R_7$, and through the negative power terminal 36.

In one embodiment, a simple short-circuit bridge or connector may be used to selectively interconnect the connection regions $R_1$–$R_7$ in a desired manner to permit current to flow through the module 30. In another embodiment, various electrical or electro-mechanical components may be disposed on the interconnect board 30 which control the flow of current between isolated connection regions.

Those skilled in the art will appreciate that an interconnect board 30 implemented in accordance with the principles of the present invention permits flexible and selective connecting of any number of electrochemical cells 50 in any desired series or parallel relationship. The interconnect board 30 further permits easy integration of various control and monitoring devices in series or parallel with respect to the electrochemical cells. The interconnect surface 32 may be patterned according to various pre-designed connection layouts to achieve desired voltage and current ratings. The manufacturability of energy storage modules that satisfy a wide range of power requirements is significantly improved by, for example, selecting among a number of interconnect boards 30 having varying interconnect surface configurations, and installing a selected interconnect board 30 in a selected module housing. A number of different module housing configurations may be designed and fabricated to house a particular number of electrochemical cells based on the energy production requirements of a particular application.

Figure 4A:
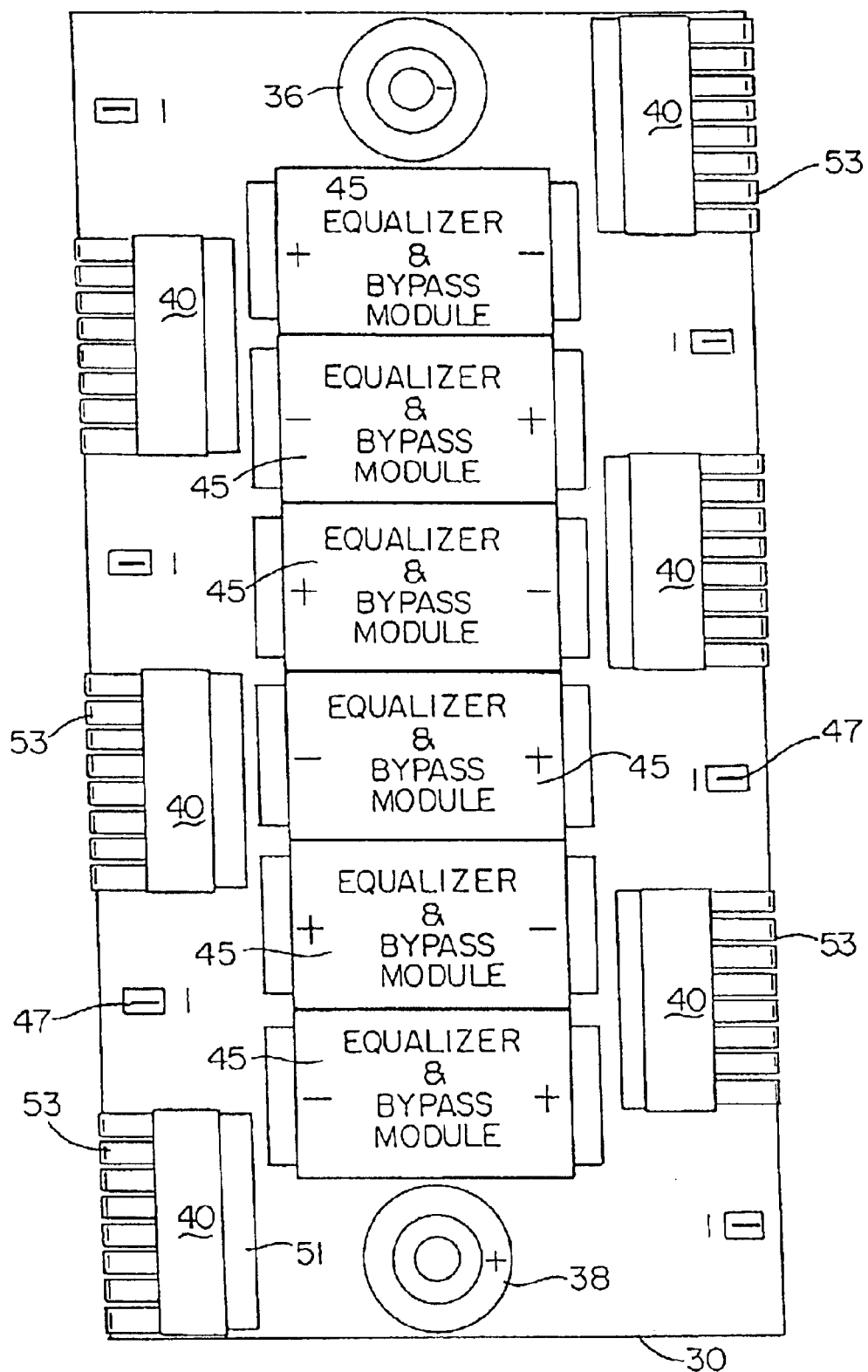
FIG. 4A illustrates another embodiment of an interconnect board which includes a number of components mounted thereon.

Turning now to FIG. 4A, there is provided a top view illustration of one embodiment of an integrated interconnect board 30 onto which a number of control devices are mounted. In either of the embodiments shown in FIGS. 4A–4B, the bottom of the interconnect board includes an interconnect surface similar in configuration to that shown in FIGS. 2–3. In the configuration shown in FIG. 4A, the energy storage module includes 48 individual electrochemical cells 50 grouped into six cell packs each comprising eight parallel connected electrochemical cells 50. In the embodiment shown in FIG. 4B, the energy storage module includes 64 individual electrochemical cells 50 grouped into eight cell packs each comprising eight parallel connected electrochemical cells 50.

Associated with each of the six cell packs in FIG. 4A is a fuse pack 40 which includes eight fuses (not shown), with one fuse being connected in series with one of the eight parallel connected electrochemical cells 50 of the cell pack. The fuses within the fuse pack 40, when activated, provide for the electrical isolation of a defective cell from the remaining cells of the cell pack. The interconnect board 70 shown in FIG. 4B includes eight fuse packs 40 and also includes temperature sensors 72 which monitor the temperature of the interconnect board. A fuse is typically activated, for example, upon the development of a short-circuit within a particular cell of a cell pack. Various types of suitable fuse devices are disclosed in co-pending application Ser. No. 08/900,929, now U.S. Pat. No. 6,099,986, entitled in-Situ Short-Circuit Protection System and Method for High-Energy Electrochemical Cells (Gauthier et al.), the contents of which are incorporated herein by reference.

A current bypass device may also be affixed to the interconnect board 30/70 and connected in series with a cell pack which, when activated, isolates a cell pack from the series connection and bypasses current around the defective cell pack. A number of suitable current bypass devices are disclosed in co-pending application Ser. No. 08/900,325, now U.S. Pat. No. 6,046,514, entitled "Bypass Apparatus and Method for Series Connected Energy Storage Devices (Rouillard et al.), the contents of which are incorporated herein by reference.

An equalizer device may further be connected in parallel with a cell pack which provides overvoltage protection and balancing of cell pack potentials during charging and discharging operations. A number of suitable equalizer devices are disclosed in co-pending application Ser. No. 08/900,607, now U.S. Pat. No. 5,952,815, entitled "Equalizer System and Method for Series Connected Energy Storage Devices" (Rouillard et al.), the contents of which are incorporated herein by reference.

In one embodiment, the equalizer device and bypass device are incorporated into a single integrated component package, such as the equalizer/bypass module 45 shown in FIG. 4A. Additionally, a communications device may be connected to each of the cell packs to facilitate monitoring and controlling of individual cell packs by an internal or external controller or processor. Also, a temperature sensor 47/72 may be mounted on the interconnect board 30/70.

In FIGS. 5A–5C, there is illustrated an embodiment of an integrated equalizer/bypass module 45 which, as discussed previously, may be mounted on the interconnect board 30/70. The integrated equalizer/bypass module 45 advantageously provides for a compact housing configuration capable of efficiently dissipating heat generated during equalization and bypass conditions through contact terminals 67, 69 affixed to the interconnect board 30/70. The heat conducted through the contact terminals 67, 69 and to the interconnect board 30/70 may further be conducted to the walls of the housing 48 through thermal conductors extending from the cells and contacting the housing walls, as will later be discussed in greater detail.

In one embodiment, the integrated equalizer/bypass module 45 has a total length, $L_T$, of 2.75 inches. The housing 65 of the equalizer/bypass module 45 has a length, $L_M$, of 2.25 inches. The total width, $W_T$, of the equalizer/bypass module 45 is 1.50 inches, while the width of the positive and negative terminals 67, 69 is 1.25 inches. The height, $H_T$, of the housing 65 is 0.625 inches, and the height or thickness, $H_c$, of the positive and negative terminals 67, 69 is 0.05 inches. The equalizer/bypass module 45 is mounted on the interconnect board 30/70. The connection surface 32 of the interconnect board 30/70 includes a patterned copper plate having a thickness of 0.05 inches. The thickness of the conductive sheet is required in order to pass a relatively high current, and virtually precludes employment of conventional photo-etched printed circuit board (PCB) techniques.

It is noted that the heat generated by the equalizer/bypass module 45 is typically conducted from the integrated module 45 and interconnect board 30/70 to the walls of the module casing 48. In accordance with this design, the equalizer can pass a current on the order of 5 amps which results in the generation of approximately 15 watts of heat. Those skilled in the art will appreciate that the high current rating of the equalizer provides for relatively high rates of energy storage system charging and discharging.

Returning to FIGS. 2–3, one embodiment of an interconnect board 30/70 includes a plastic sheet 34, onto which a number of components are mounted, and a separate sheet of electrically conductive material, which is patterned to form an interconnect surface 32. The patterned conductive sheet is subsequently affixed to the plastic sheet 34. In one embodiment, the conductive sheet constitutes a copper sheet having a thickness of 0.05 inches and a width and length which varies depending on the size of the module 35. The copper sheet is machine milled to develop individual connection regions thereon in accordance with a pre-designed pattern layout. It is noted that the pattern layout should be designed to minimize the volume and weight of the copper sheet.

Following machining of the copper sheet, each of the individual copper connection regions is cleaned and mounted to the plastic board 34 at appropriate locations to facilitate the reconstruction of the pre-designed pattern layout. The plastic board 34 typically has a thickness of approximately 0.1 inches, and has a construction similar to circuit boards commonly used within the electronics industry. The copper connection regions may be affixed to the plastic board 34 by conventional adhesion or fastening techniques. It is understood that conductive materials other than copper, such as aluminum for example, may be employed to fabricate the connection regions.

In an embodiment in which various electronic devices are used to monitor and control electrical and thermal energy generated within the module 35, such devices are then mounted to the integrated interconnect board 30/70. For example, a number of equalizer/bypass modules 45 and communication devices 47 are mounted to the interconnect board 30/70. The equalizer/bypass modules 45 and positive and negative power terminals 38, 36 may be welded to the interconnect board 30/70, such as by employing a known ultrasonic welding technique. Alternatively, an air flow brazing or spot welding technique may be employed to mount the equalizer/bypass module 45 and terminals 36, 38 to the interconnect board. 30/70.

In addition to mounting the equalizer/bypass modules 45 and terminals 36, 38, the fuse packs 40 may be mounted on one or both sides of the interconnect board 30/70, depending on the cell configuration and the need to minimize the weight and volume of the interconnect surface 32. One side 51 of the fuse packs 40 is ultrasonically welded to the interconnect board 30/70. It is noted that the use of ultrasonic welding to mount various components to the interconnect board 30/70 results in the overall reduction in heat generated during the welding procedure in comparison to other known welding techniques. However, air flow brazing, soldering, or spot welding techniques may be employed in combination with well-designed heat sinks.

Finally, the interconnect board 30/70 is mounted on the stack 46 of electrochemical cells 50. Each of the cell terminals 52 is connected to the interconnect board 30/70, which may be performed by ultrasonic welding, soldering, or spot welding. Table 1 below provides various data associated with the use of an interconnect board 30/70, such as that shown in FIGS. 4A–4B, for interconnecting a number of individual electrochemical cells 50 and various electronic devices encased in a sealed module housing 48. The data tabulated in Table 1 demonstrates that a total resistance of approximately 8 micro-ohms and a total weight of 7 to 14 grams may be realized by employing an integrated interconnect board 30/70 of the type illustrated herein for use in a power system capable of passing on the order of 400 A of peak current with less than approximately 4 mV of voltage drop across the power terminals and a power loss on the order of 1 watt.

108 incorporates a hermetic seal 115, such as that described below with respect to FIGS. 7–9, that seals various feedthroughs provided in the inner shell cover 108.

In accordance with one embodiment, the module 100 includes a stack 105 of electrochemical cells 121 which are interconnected through use of the interconnect board 104. The stack 105 of electrochemical cells 121 are segregated into six cell packs 125, all of which are banded together by use of two bands 127 and two opposing end plates 129. The 48 electrochemical cells 121 are subjected to a continuous compressive force generated by use of the bands 127/end plates 129 and a foam or spring-type element disposed within or adjacent each of the cells 121. Each electrochemical cell 121 includes a thermal conductor which is spot welded or otherwise attached respectively to one or both of the positive and negative cell contacts.

The positive and negative contacts of the thermal conductors carry current from the cells 121 to the interconnect board 104. The thermal conductors also conduct heat from the cells to a metallic inner shell 101 which serves as a heat sink. The thermal conductors include a spring portion which deforms when the cell 121 is inserted into the inner shell 101, accommodating tolerances in cell length and changes in separation distances between the cells 121 and the inner shell 101.

The inner shell 101 has a thickness of approximately 1 mm and is fabricated from deep drawn aluminum or stainless steel. The interior sides of the inner aluminum shell 101 include an anodized coating having a thickness of approximately 0.64 mm. The anodized surface of the inner shell 101 provides electrical insulation between adjacent cells 121, yet provides for the efficient transfer of heat generated from the cells 121 through contact with the resilient cell conductors. In the case of a stainless steel inner shell 101, thin plastic or mica sheet may be situated between the cells 121 and the inner shell walls.

The interconnect board 104 is situated above the cell stack 105 and includes control circuitry for each of the respective six cell packs 125 constituting the cell stack 105. Each cell pack control unit 113 includes a short circuit protection device such as a fuse pack 107, a bypass device, and an equalizer circuit which control the operation of the cell pack 125 while charging and discharging. Accordingly, each of the cell packs 125 is monitored and controlled by a respective cell pack control unit 113. A control board 106, situated above the interconnect board 104, includes a processor that monitors and controls each of the six cell pack control units 113. As such, the control board 106 provides for cell pack and module level monitoring and control during charging and discharging operations.

A pair of quick connectors 117 pass through corresponding holes provided in an inner shell cover 108 and serve as

TABLE 1

| Material | Thickness Mils | Volume cube meter | Weight grams | Resistance microohm @ 80° C. | Volt. drop mVolts | Power Watts | Energy Joules |
|---|---|---|---|---|---|---|---|
| Copper | 50 | 1.6E−06 | 14.41 | 8.39 | 3.36 | 1.34 | 40.29 |
| Aluminum | 80 | 2.58E−06 | 6.94 | 8.64 | 3.46 | 1.38 | 41.48 |

Figure 6:
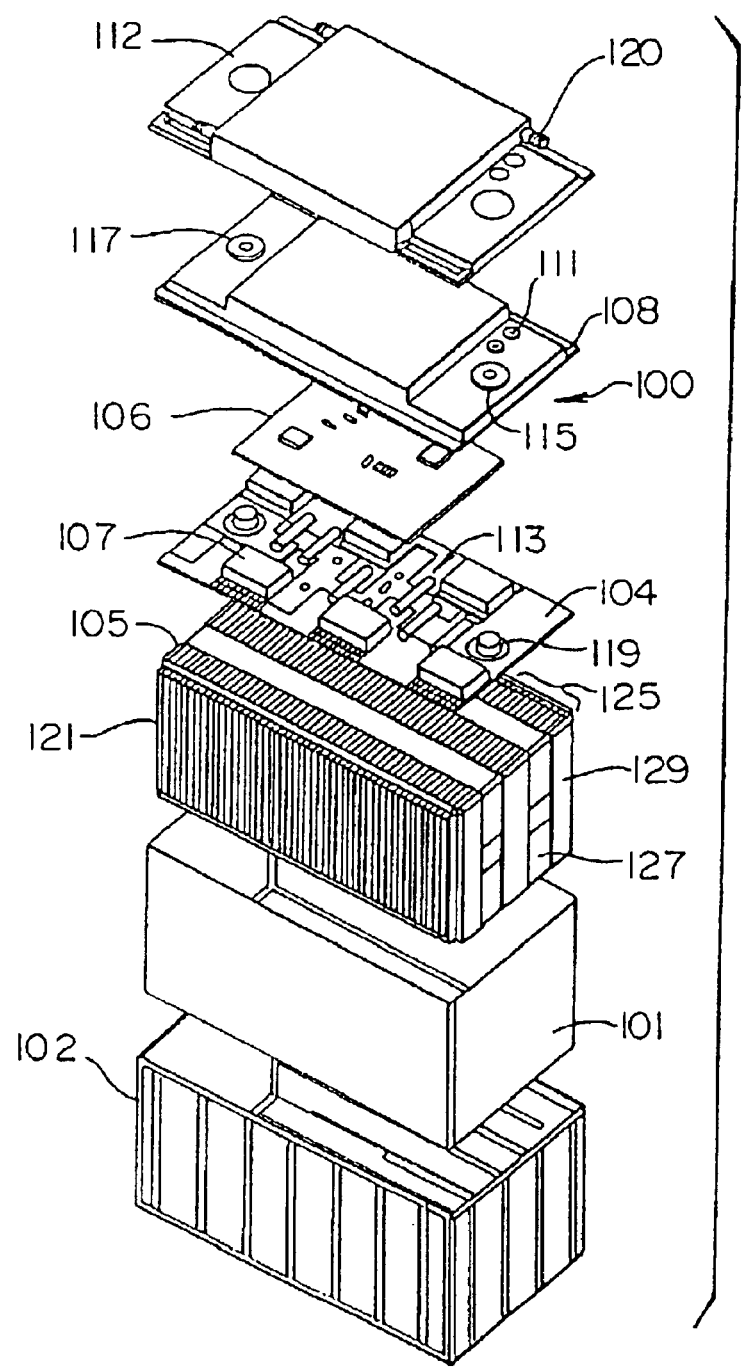
FIG. 6 is an exploded view of an energy storage module including an interconnect board disposed in a hermetically sealed housing.

In FIG. 6, there is illustrated an exploded view of a power generating module 100 that includes an inner shell 101 which contains a stack 105 of electrochemical cells 121 and various electronic boards, including an interconnect board 104 of the type previously discussed. An inner shell cover the main power terminals of the module 100. The quick connectors 117 are hermetically sealed to the inner shell cover 108 using a sealing apparatus 115. When an outer shell cover 112 is positioned onto the inner shell cover 108, the quick connectors 117 are received into mating sockets 119 mounted on the interconnect board 104. Communication connectors 111, which pass through the inner shell cover 108 and are similarly hermetically sealed thereto, provide external access to the control board 106 and other electronic boards of the module 100.

A hermetic seal is provided between the inner shell 101 and inner shell cover 108 by welding the inner shell cover 108 to the top of the inner shell 101. The hermetically sealed inner shell 101 is then inserted into an outer shell 102. The outer shell 102 may be fabricated from glass filled polypropylene through use of an injection molding process, and has a thickness of approximately 2 mm. The outer shell 102 includes ribs on three sides of the inner surface which form flow channels when the inner shell 101 is installed in the outer shell 102 for the purpose of transporting a heat transfer fluid therebetween. The outer shell cover 112 may be vibration welded to the top of the outer shell 102. Fluid connectors 120 are disposed on the outer shell cover 112 and provide for the flow of heat transfer fluid into and out of the module 100.

Figure 7:
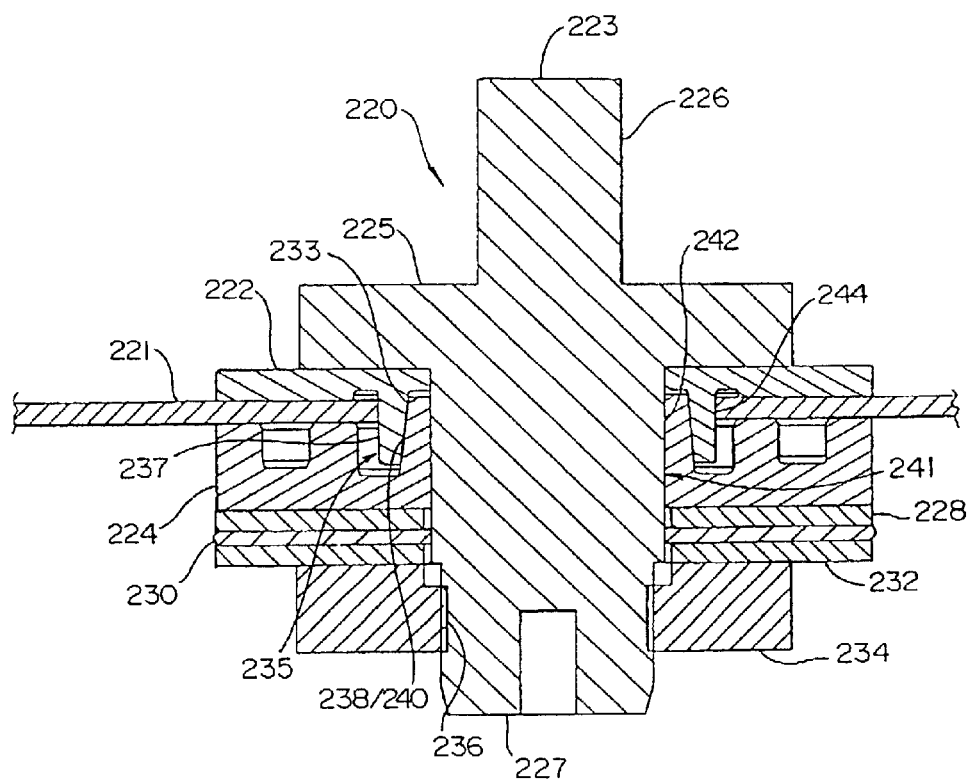
FIGS. 7–9 illustrate an embodiment of a hermetic seal for use in a sealing various types of conduits or feed-throughs that pass into a module housing.
Figure 8:
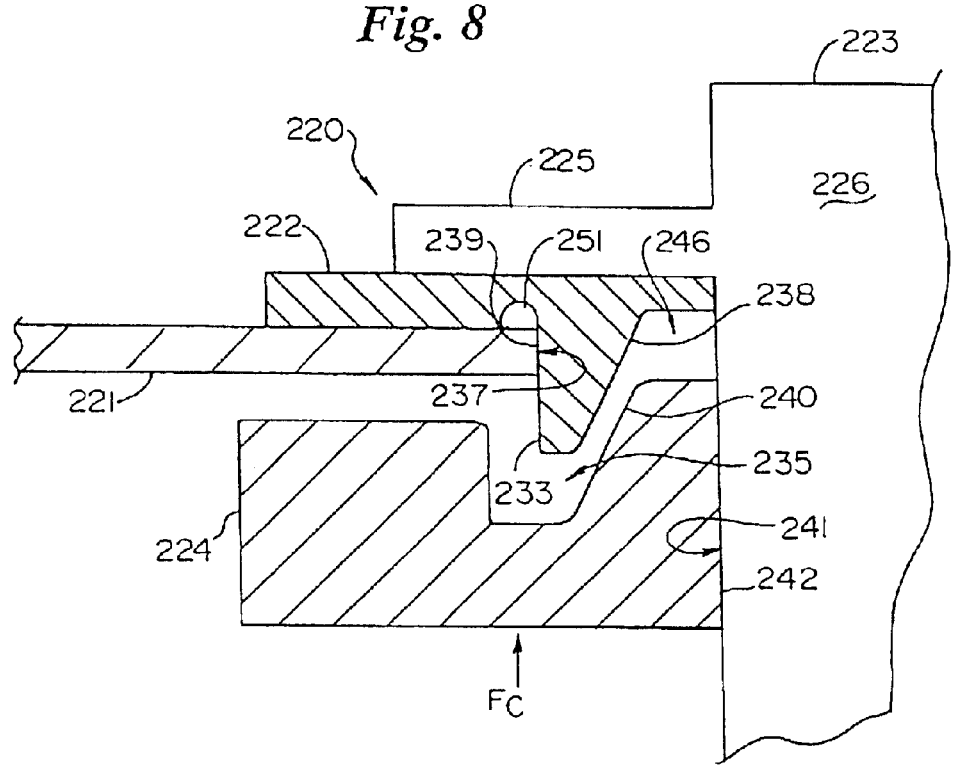
Figure 9:
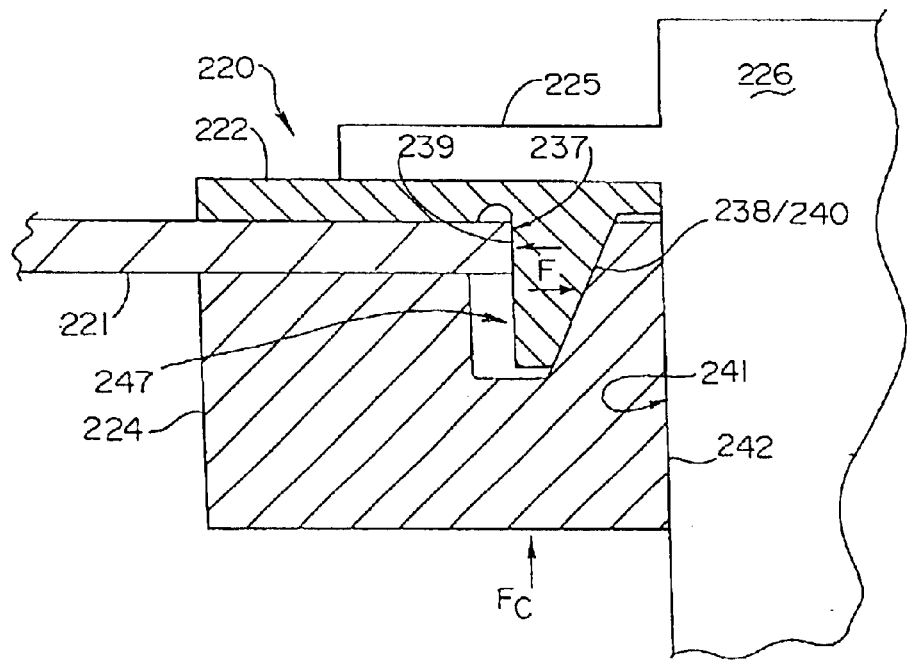

Referring to FIGS. 7–9, there is illustrated a hermetic seal apparatus which may be employed to provide hermetic sealing between a conduit, such as an electrical feed-through provided in a housing cover of a power generating module, and a passage in the housing. Power and communication lines, for example, may be passed through the conduit to provide external connectivity with power and electronic components contained within the hermetic environment of an encased power generating module.

The hermetic seal 220 shown in FIGS. 7–9 includes a first seal body 222 having a central passage which is in general alignment with a hole provided through a substantially planar plate 221, such as a cover of a power generating module housing. A second seal body 224 of the seal 220 also includes a central passage which is in general alignment with the hole of the cover 221 and the central passage of the first seal body 222. The first seal body 222 is disposed on an upper surface of the cover 221, and the second seal body 224 is disposed on a lower surface of the cover 221.

In one embodiment, the first seal body 221 includes a collar 233 which extends through the hole of the cover 221 and bears against an inner surface 239 of the hole. The collar 233 includes a tapered inner surface 238 which tapers away from the central passage of the first seal body 222. The second seal body 224 includes a groove 235 having an inner tapered surface 240 which tapers toward the central passage of the second seal body 224.

As is best illustrated in the pre-sealed and post-sealed depictions provided in FIGS. 8 and 9, respectively, the collar 233 of the first seal body 222 is received by the groove 235 provided in the second seal body 224 such that the tapered surfaces 238, 240 of the first and second seal bodies 222, 224 slidably engage one another as the collar 233 is forced into the groove 235. Engagement of the opposing tapered surfaces 238, 240 of the first and second seal bodies 222, 224 in a fully installed configuration forces a portion 237 of the outer surface of the collar 233 to cold flow against the inner surface 239 of the hole provided in the cover 221. Those skilled in the art will appreciate that cold flowing one material against another material forms an extremely tight seal between the two materials. As such, a hermetic seal is provided between the inner surface 239 of the hole and the collar 233 through slidable engagement between the collar 233 of the first seal body and the groove 235 provided in the second seal body 224.

As is further shown in FIGS. 7–9, a conduit 226, having a first end 223 and an opposing second end 227, passes through the hole in the cover 221 and the central passages of the first and second seal bodies 222, 224. The conduit 226 includes a central passage through which electrical and communication lines may pass into the internal hermetic environment of a housing to which the cover 221 is mounted. The conduit 226 includes a flange 225 which extends outwardly from the first end 223 of the conduit 226 and contacts a surface of the first seal body 222. The conduit 226 has a diameter which is substantially equivalent to the diameter of the central passages of the first and second seal bodies 222, 224 such that an outer surface 242 of the conduit 226 forms a tight, smooth fit with the inner diameter surfaces of the first and second seal body central passages.

A portion of the second end 227 of the conduit 226 is threaded so that a nut 234 may be secured thereon. The seal 220 also includes a thrust washer 228 that abuts a lower surface of the second seal body 224. A wave washer 230 is disposed between the thrust washer 228 and a second thrust washer 232. A nut 234, in abutment with the second thrust washer 232, exerts an axially directed compressive force on the elements of the hermetic seal 220 as the nut 234 is tightened on the threaded second end 227 of the conduit 226.

As is best seen in FIG. 9, a compressive force, $F_c$, produced by the tightened nut 234 causes the wave washer 230 to compress which, in turn, forces the inwardly tapered inner surface 240 of the second seal body 224 into slidable engagement with the outwardly tapered inner surface 238 of the first seal body 222. Application of the compressive force, $F_c$, drives the inner diameter surface 241 of the second seal body 224 inwardly against the outer surface 242 of the conduit 226. Slidable engagement between the two tapered surfaces 238, 240 also drives a portion 237 of the collar 233 into tight engagement with the inner surface 239 of the hole provided in the cover 221. After tightening the nut 234 to generate an appropriate level of compressive force, $F_c$, the wave washer 230 continues to apply the compressive force, $F_c$, so as to maintain the integrity of the hermetic seal 220 over the service life of the seal. It is understood that the compressive force, $F_c$, may be produced by a fastener apparatus other than that shown in FIG. 7, such as by use of a spring-loaded metal keeper. Other retention devices which are capable of maintaining a continuous compressive force, $F_c$, may also be employed.

In one embodiment, the cover 221 is constructed from a metallic material, such as aluminum or stainless steel, and the first and second seal bodies 222, 224 are fabricated from a plastic material, such as polypropylene plastic. The conduit 226 may be fabricated from a metallic or a plastic material. It is noted that gaps 246, 247 may be provided in the first and second seal bodies 222, 224, respectively, to accommodate positional shifting between the first and second seal bodies 222, 224 occurring from forced engagement of the two tapered surfaces 238, 240. Also, a notch 251 may be provided in the first seal body 222 to facilitate movement of the collar 233 in a direction toward the inner surface of the hole of the cover 221 in response to slidable engagement between the two tapered surfaces 238, 240.

Figure 12:
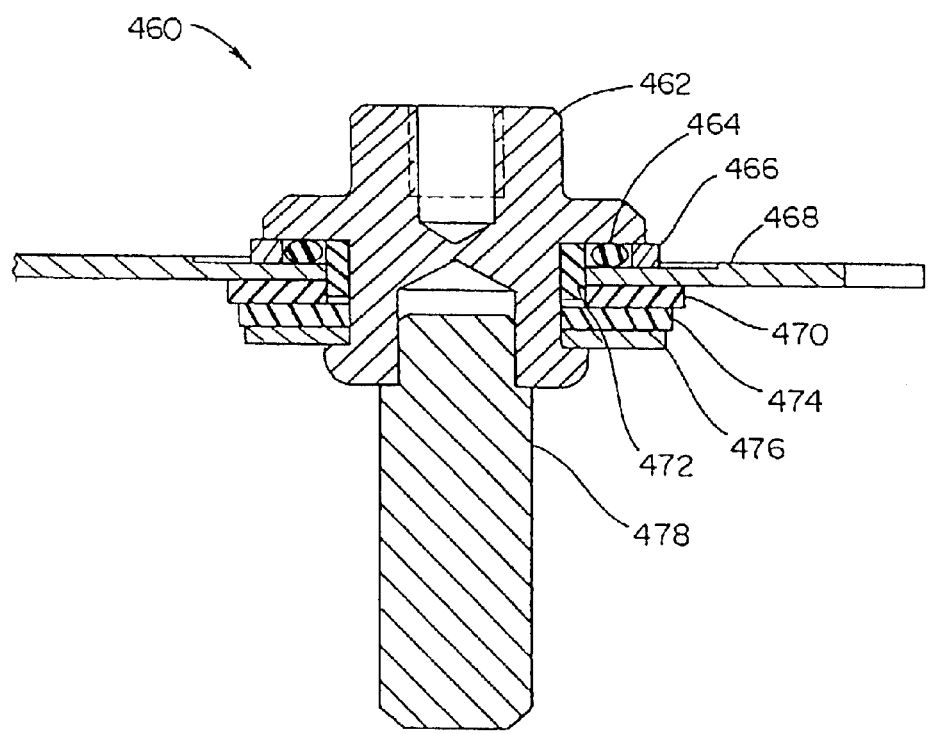
FIGS. 12–13 illustrate another embodiment of a hermetic seal for use in a sealing various types of conduits or feed-throughs that pass into a module housing.
Figure 13:
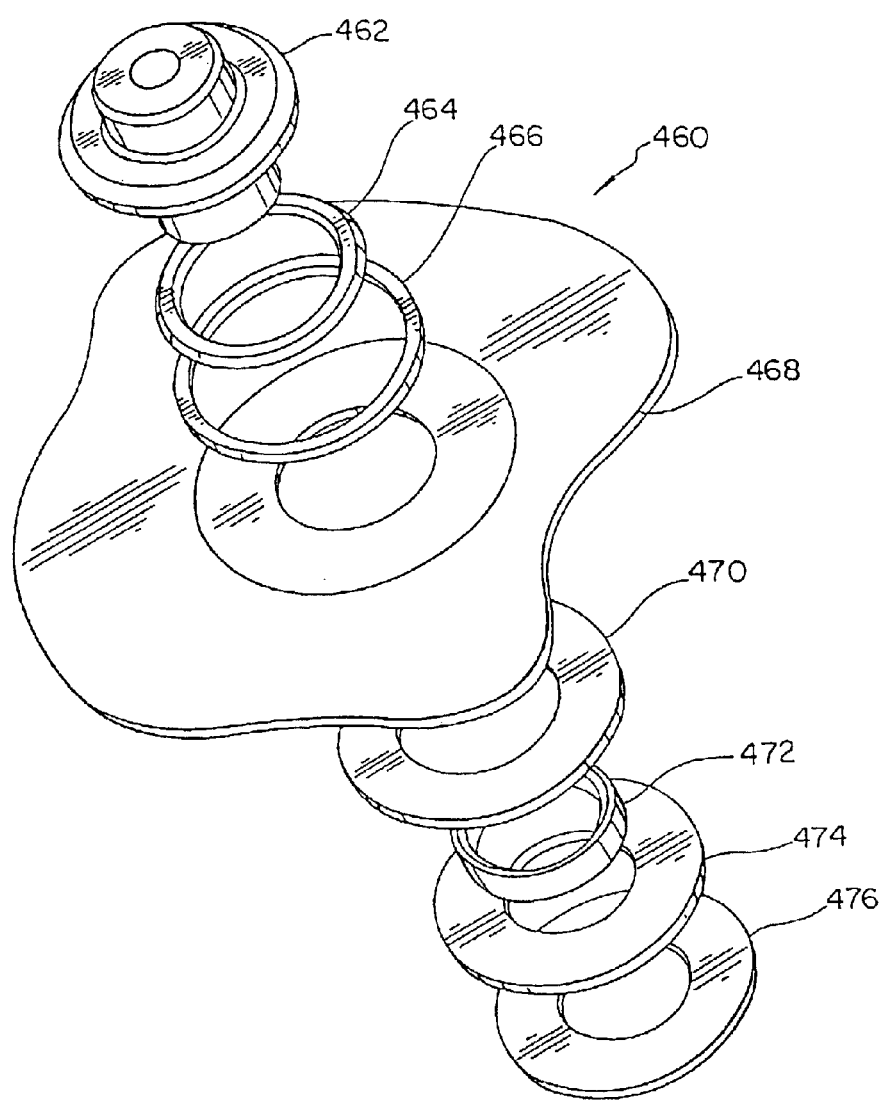

An alternative hermetic sealing apparatus or feed-through is shown in FIGS. 12–13. In accordance with this embodiment, hermetic sealing is provided primarily by an o-ring 464 which is compressed between a flanged conductor or terminal 462 and a wall or cover 468 of the module housing. A phenolic support 466 keeps the flanged conductor 462 at a constant distance from the cover 468, thus creating a cavity whose dimensions are stable over time. This arrangement prevents flowing of the o-ring material with time and high temperature.

A polypropylene ring 470 and sleeve 472 electrically insulate the bottom portion of the feed-through from the cover 468. In contrast to the phenolic ring material, polypropylene maintains its high dielectric strength even after being subjected to arcing. It is noted that arcing typically occurs, if at all, between the o-ring 464 and the polypropylene sleeve 472. Another advantage of using polypropylene material for the ring 470 and sleeve 472 material is that it provides a coefficient of friction that is sufficient to prevent the assembly from turning when subjected to the torque generated when wires are connected to the flanged conductors 462. The Belleville spring 474 is flattened when the feed-through is crimped. The Belleville spring 474 ensures that the assembly will be kept under pressure even if the polypropylene flows over time. The metal washer 476 helps to distribute pressure evenly across the surface of the polypropylene ring 470.

In general, the above-described hermetic sealing apparatuses exhibit a high dielectric strength between the housing cover or wall and a power conductor passing through the cover. Power terminal voltages on the order of 2,000 V can be accommodated without occurrences of arcing. Tight sealing (e.g., $10^{-8}$-cc-atm/sec) is maintained even when subjected to mechanical stresses. The hermetic seals also exhibit good torque resistance and good overall mechanical resistance.

Figure 10:
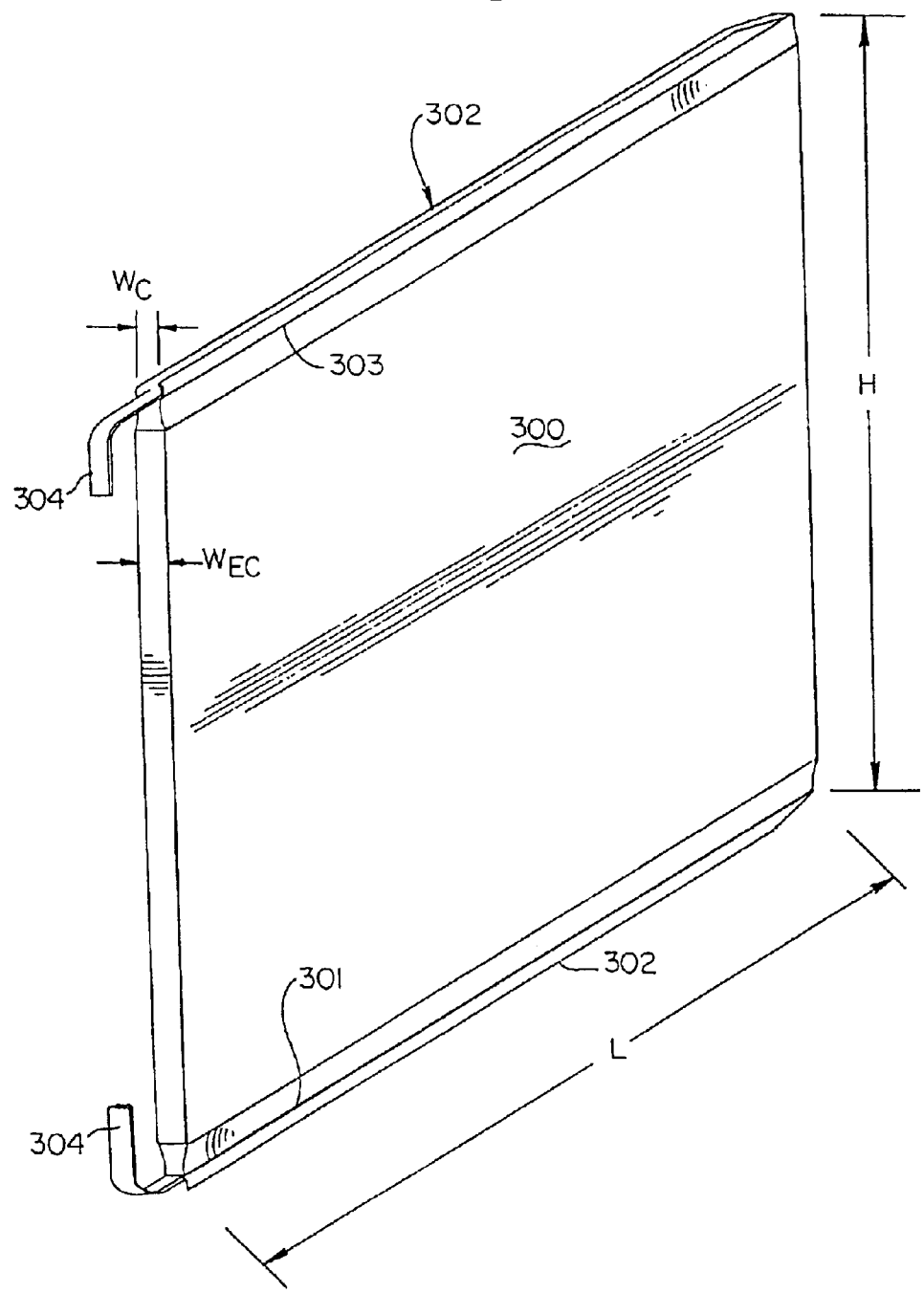
FIG. 10 is an illustration of a prismatic electrochemical cell which represents one embodiment of an energy storing device which may be used in combination with an integrated interconnect board within a sealed module housing in accordance with an embodiment of the present invention.
Figure 11:
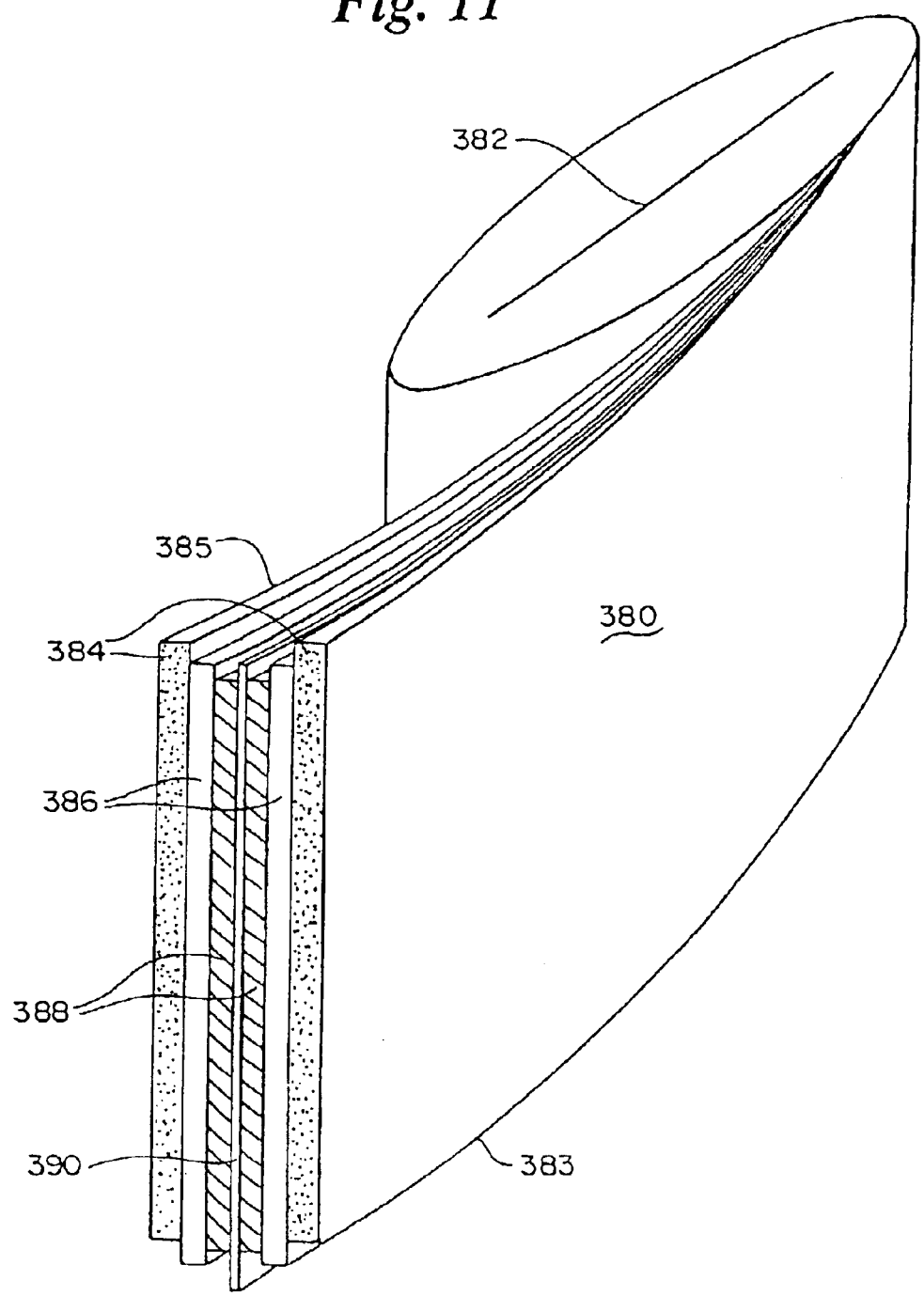
FIG. 11 is a depiction of various film layers constituting an electrochemical cell in accordance with the embodiment shown in FIG. 10.

In accordance with one embodiment of the present invention, the power sources shown in FIG. 6 may constitute solid-state, thin-film cells of the type shown in FIGS. 10–11. Such thin-film electrochemical cells are particularly well-suited for use in the construction of high-current, high-voltage power generating modules and batteries, such as those used to power electric vehicles for example. In FIG. 10, there is shown an embodiment of a prismatic electrochemical cell 300 which includes an anode contact 301 and a cathode current collector contact 303 formed respectively along opposing edges of the electrochemical cell 300.

A thermal conductor 302 is spot welded or otherwise attached to each of the anode and cathode contacts 301, 303, respectively. A thermal conductor 302 is typically disposed along the length of the anode contact 301 and the cathode current collector contact 303, and typically includes an electrical connection lead 304 for conducting current into and out of the electrochemical cell 300, the current being collected and conducted along the anode and cathode contacts 301, 303. The thermal conductor 302 may be fashioned from copper and have a substantially C-shaped, double C-shaped, Z-shaped, V-shaped, S-shaped or O-shaped cross-section.

In this embodiment, the electrochemical cell 300 is fabricated to have a length L of approximately 135 mm, a height H of approximately 149 mm, and a width $W_{ec}$ of approximately 5.4 mm or approximately 5.86 mm when including a foam core element. The width $W_c$ of the cathode current collector contact 303 and the anode contact 301 is approximately 3.9 mm, respectively. Such a cell 300 typically exhibits a nominal energy rating of approximately 36.5 Wh, a peak power rating of 87.0 W at 80 percent depth of discharge (DOD), and a cell capacity of 14.4 Ah at full charge. Each of the electrochemical cells 300 has a nominal operating voltage ranging between approximately 2.0 V and 3.1 V.

The electrochemical cell shown in FIG. 10 may have a construction similar to that illustrated in FIG. 11. In this embodiment, an electrochemical cell 380 is shown as having a flat wound prismatic configuration which incorporates a solid polymer electrolyte 386 constituting an ion transporting membrane, a lithium metal anode 384, a vanadium oxide cathode 388, and a central current collector 390. These film elements are fabricated to form a thin-film laminated prismatic structure, which may also include an insulation film, such as polypropylene film.

A known sputtering metallization process is employed to form current collector contacts along the edges 385, 383 of the anode and cathode current collector films 384, 390, respectively. It is noted that the metal-sprayed contacts provide for superior current collection along the length of the anode and cathode film edges 385, 383, and demonstrate good electrical contact and heat transfer characteristics. A spring-like thermal conductor or bus bar, such as the thermal conductor 302 shown in FIG. 10, is then spot-welded or otherwise attached to the metal-sprayed contact. The electrochemical cells illustrated in the Figures may be fabricated in accordance with the methodologies disclosed in U.S. Pat. Nos. 5,423,110, 5,415,954, and 4,897,917.

It will, of course, be understood that modifications and additions can be made to the various embodiments discussed hereinabove without departing from the scope or spirit of the present invention. By way of example, the principles of the present invention may be employed for use with battery technologies other than those exploiting lithium polymer electrolytes, such as those employing nickel metal hydride (Ni-MH), lithium-ion, (Li-Ion), and other high-energy battery technologies. Accordingly, the scope of the present invention should not be limited by the particular embodiments discussed above, but should be defined only by the claims set forth below and equivalents thereof.

What we claim is:

1. A method of connecting a plurality of thin-film electrochemical cells disposed in a hermetically sealed housing of an energy storing module to positive and negative terminals passing through the housing, the method comprising:

forming a connection pattern on an electrically conductive surface of an interconnect board;

installing the interconnect board in the housing;

connecting positive and negative contacts of the interconnect board to the positive and negative housing terminals;

connecting leads of the electrochemical cells to the connection pattern; and hermetically sealing the housing.

2. The method of claim 1, wherein hermetically sealing the module housing comprises hermetically sealing the positive and negative terminals passing through the housing.

3. The method of claim 1, wherein connecting the leads includes ultrasonically welding the leads of the electrochemical cells to the connection pattern.

4. The method of claim 1, wherein voltage and current characteristics of the energy storing module are alterable by altering the connection pattern formed on the electrically conductive surface of the interconnect board.

5. The method of claim 1, wherein forming the connection pattern comprises processing a metallic sheet material to include one of a machine milled connection pattern, a stamped connection pattern, or a chemically etched connection pattern.

6. The method of claim 1, wherein forming the connection pattern further comprises:

forming a plurality of connection regions each being connected to particular ones of the plurality of electrochemical cells; and electrically coupling the connection regions together and to the positive and negative contacts of the interconnect board.

7. The method of claim 6, wherein electrically coupling the connection regions together comprises electrically coupling the connection regions together using a current bypass device.

* * * * *